United States Patent
Krummacher et al.

(10) Patent No.: US 8,653,548 B2
(45) Date of Patent: Feb. 18, 2014

(54) LIGHT-EMITTING DEVICE

(75) Inventors: Benjamin Claus Krummacher, Regensburg (DE); Florian Schindler, Traunstein (DE); Markus Klein, Tegernheim (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 642 days.

(21) Appl. No.: 12/808,156

(22) PCT Filed: Nov. 12, 2008

(86) PCT No.: PCT/DE2008/001868
§ 371 (c)(1),
(2), (4) Date: Sep. 7, 2010

(87) PCT Pub. No.: WO2009/074127
PCT Pub. Date: Jun. 18, 2009

(65) Prior Publication Data
US 2011/0018009 A1    Jan. 27, 2011

(30) Foreign Application Priority Data

Dec. 12, 2007    (DE) .......................... 10 2007 059 732

(51) Int. Cl.
*H01L 33/44*    (2010.01)
(52) U.S. Cl.
USPC .................. 257/98; 257/E33.067; 438/31
(58) Field of Classification Search
USPC .............................. 257/98, E33.067; 438/31
See application file for complete search history.

(56) References Cited

U.S. PATENT DOCUMENTS

| | | | |
|---|---|---|---|
| 6,091,547 A * | 7/2000 | Gardiner et al. | 359/625 |
| 6,906,452 B2 * | 6/2005 | Ichikawa | 313/110 |
| 2002/0080598 A1 * | 6/2002 | Parker et al. | 362/31 |
| 2003/0147119 A1 * | 8/2003 | Samson | 359/326 |
| 2004/0036990 A1 * | 2/2004 | Hanano | 359/831 |
| 2004/0141302 A1 * | 7/2004 | Koch et al. | 362/31 |
| 2004/0188690 A1 * | 9/2004 | Noguchi | 257/79 |
| 2004/0237065 A1 | 11/2004 | Brousek et al. | |
| 2005/0122035 A1 * | 6/2005 | Birnstock et al. | 313/504 |
| 2006/0056166 A1 * | 3/2006 | Yeo et al. | 362/19 |
| 2006/0132919 A1 | 6/2006 | Schnell et al. | |
| 2006/0290651 A1 * | 12/2006 | Verhaegh et al. | 345/107 |
| 2007/0063140 A1 * | 3/2007 | Liu | 250/301 |
| 2007/0153543 A1 * | 7/2007 | Xu et al. | 362/600 |
| 2007/0176195 A1 * | 8/2007 | Kuiseko et al. | 257/98 |
| 2007/0217702 A1 | 9/2007 | Sung | |
| 2007/0230211 A1 * | 10/2007 | Osato et al. | 362/600 |
| 2009/0015142 A1 * | 1/2009 | Potts et al. | 313/504 |
| 2009/0261371 A1 | 10/2009 | Schindler et al. | |

FOREIGN PATENT DOCUMENTS

| | | |
|---|---|---|
| DE | 102 55 933 | 6/2004 |
| DE | 103 12 219 | 10/2004 |
| DE | 10 2004 049 954 | 4/2006 |
| DE | 10 2006 052 029 | 3/2008 |

(Continued)

*Primary Examiner* — Steven J Fulk
(74) *Attorney, Agent, or Firm* — Cozen O'Connor

(57) ABSTRACT

A light-emitting device comprising a light-emitting layer and a light exit layer. In this case, the light exit layer has a multiplicity of mutually parallel first areas, arranged in an inclined fashion with respect to the light-emitting layer. The light exit layer furthermore has a multiplicity of mutually parallel second areas arranged in an inclined fashion with respect to the light-emitting layer and in an inclined fashion with respect to the first areas. The first areas are transparent and the second areas are reflective to light emitted by the light-emitting layer.

10 Claims, 6 Drawing Sheets

(56) References Cited

FOREIGN PATENT DOCUMENTS

| | | |
|---|---|---|
| JP | 9-115667 | 5/1997 |
| JP | 2001-159704 | 6/2001 |
| JP | 2003-257661 | 9/2003 |
| JP | 2004-296423 | 10/2004 |
| JP | 2006-059543 | 3/2006 |
| JP | 2006-351211 | 12/2006 |
| JP | 2007-080890 | 3/2007 |
| JP | 2007-234578 | 9/2007 |
| JP | 2007-538363 | 12/2007 |
| WO | WO 2004/013921 | 2/2004 |
| WO | WO 2004/084259 | 9/2004 |
| WO | WO 2005/114762 | 12/2005 |
| WO | WO 2007/049213 | 5/2007 |
| WO | WO 2007/102390 | 9/2007 |

* cited by examiner a)

b) Typ A-1:

c) Typ A-2:

d) Typ B:

a)

b)

a)

b)

a)

b)

c)

a)

b)

LIGHT-EMITTING DEVICE

RELATED APPLICATION

This is a U.S. National Phase Application under 35 USC §371 of International Application PCT/DE2008/001868 filed on Nov. 12, 2008.

This patent application claims the priority of German Patent Application No. 10 2007 059 732.2 filed Dec. 12, 2007, the disclosure content of which is hereby incorporated by reference.

FIELD OF THE INVENTION

The invention relates to light-emitting devices comprising a light-emitting layer or a light-emitting element. The invention furthermore relates to methods for producing such light-emitting devices.

BACKGROUND OF THE INVENTION

Light-emitting devices such as an OLED (organic light-emitting diode), for example, usually have a Lambertian emission profile. However, a directional emission profile deviating therefrom is usually more suitable for lighting purposes.

SUMMARY OF THE INVENTION

It is an object of the invention to provide a light-emitting device having an emission profile that deviates from that of a Lambertian emitter.

A light-emitting device in accordance with a first aspect of the invention comprises a light-emitting layer and a light exit layer. In this case, the light exit layer has a multiplicity of mutually parallel first areas arranged in an inclined fashion with respect to the light-emitting layer. The light exit layer furthermore has a multiplicity of mutually parallel second areas arranged in an inclined fashion with respect to the light-emitting layer and in an inclined fashion with respect to the first areas. The first areas are transparent and the second areas reflective to light emitted by the light-emitting layer.

To a first approximation, planar light exit layers have a Lambertian emission profile with a main emission direction perpendicular to the light exit area. According to the invention, only the first areas constitute light exit areas, whereby the emission profile has a main emission direction that is not perpendicular to the light-emitting layer and therefore not perpendicular to the plane in which the light-emitting device is areally formed. With respect to said plane, the emission profile deviates from that of a Lambertian emitter.

In one advantageous configuration, the light-emitting layer of the light-emitting device comprises an organic material. Light-emitting layers based on organic materials can be produced with a large area and are therefore particularly good for light-emitting devices embodied as area emitters.

In a further advantageous configuration of the light-emitting device, the first areas and the second areas have in every direction an extent that is larger than a wavelength of the light emitted by the light-emitting layer.

However, said extent is preferably less than 1 mm, and particularly preferably less than 100 μm.

In a further advantageous configuration of the light-emitting device, a surface of the light exit layer which faces away from the light-emitting layer is structured by prisms arranged in a parallel fashion wherein the first areas and the second areas are formed by areas of the prisms. As an alternative it is also possible for a surface of the light exit layer which faces away from the light-emitting layer to be structured by conical or pyramidal or lens-shaped or cylindrical elements, wherein the first areas and the second areas are analogously formed by areas of these elements.

The light exit layer of the light-emitting device can advantageously be formed by a substrate or a passivation layer.

A light-emitting device in accordance with a second aspect of the invention comprises a carrier and a plurality of light-emitting elements. In this case, the carrier has a plurality of mutually parallel first areas and a plurality of mutually parallel second areas arranged in an inclined fashion with respect to the first areas. The light-emitting elements are arranged on the first areas. According to the invention, therefore, only the first areas constitute light-emitting areas. These areas are inclined with respect to the plane in which the light-emitting device is areally formed. As a result, the emission profile has a main emission direction that is not perpendicular to the plane in which the light-emitting device is areally formed. With respect to said plane, the emission profile, as in the case of a light-emitting device in accordance with the first aspect of the invention, deviates from that of a Lambertian emitter.

Light-emitting elements preferably have an OLED. Furthermore, it is preferred for the carrier of the light-emitting device to be structured by prisms arranged in a parallel fashion, wherein the first areas and the second areas are formed by areas of the prisms.

A light-emitting device in accordance with a third aspect of the invention comprises a substrate and a layer sequence applied to a surface of the substrate and having at least one light-emitting layer, wherein the surface of the substrate is height-structured periodically in a lateral direction. In the case of a device in accordance with this aspect of the invention, the height-structured substrate performs, in addition to its function as a substrate for a light-emitting layer sequence, the function of the carrier mentioned above. The light-emitting device therefore has a light-emitting area that is height-structured like the surface of the substrate. The height structuring of the surface can be embodied in such a way that regions of the surface are inclined with respect to the plane of the areal extent of the light-emitting device. The advantages of the second aspect of the invention are correspondingly afforded.

In one advantageous configuration, the light-emitting layer comprises an organic material.

In a further advantageous configuration of the light-emitting device, the height structuring rises and falls linearly in one lateral direction and the surface of the substrate has substantially plane areas.

In a further advantageous configuration of the light-emitting device, the height structuring rises and/or falls nonlinearly in one lateral direction and the surface of the substrate has curved areas. The emission profile of such a light-emitting device can be set within wide limits.

Preferably, the substrate can be produced from plastic in an injection molding method or consists of metal, structured by an embossing method.

A light-emitting device in accordance with a fourth aspect of the invention comprises a light-emitting layer which has strip-type first regions and second regions arranged alternately in a lateral direction, wherein the first regions and the second regions have different refractive indices. In the case of such a light-emitting device, diffraction effects lead to an emission profile that deviates from that of a Lambertian emitter.

In this case, the dimension of the first regions and of the second regions in the lateral direction is preferably of the order of magnitude of a wavelength of the light emitted by the light-emitting layer. It is particularly preferably smaller than 5-times the wavelength.

In an advantageous configuration, the light-emitting layer comprises an organic material.

In a method for producing a light-emitting device comprising a light-emitting layer in accordance with a fifth aspect of the invention, regions of the light-emitting layer are irradiated with UV light in order to alter the refractive index in the regions. This production method makes it possible to produce a light-emitting device in accordance with the fourth aspect of the invention. It is suitable for producing large-area devices and incorporates well in particular into known production methods for areal OLEDs.

A light-emitting device according to a sixth aspect of the invention comprises a light-emitting layer and a light exit layer, wherein a multiplicity of anisotropic scattering particles are arranged in or on the light exit layer, said particles being oriented along a lateral direction of the light-emitting device. The orientation of the scattering particles in conjunction with their anisotropy, leads to anisotropic scattering of the light emerging from the light-emitting device. This leads to an emission profile of the light-emitting device that deviates from the Lambertian emission profile, wherein the emission profile is dependent on the scattering behavior and degree of anisotropy of the scattering particles.

The light-emitting layer preferably comprises an organic material. It is furthermore preferred for the scattering particles to be anisotropic with regard to their dimensions and/or with regard to their scattering behavior.

Furthermore, it is preferred for the scattering particles (16) to have a permanent or inducible electric or magnetic dipole or quadrupole moment that is different than zero, or for the scattering particles to be self-assembling molecules or to be arranged in an expandable film.

In a method for producing a light-emitting device comprising a light-emitting layer in accordance with a seventh aspect of the invention, scattering particles having a permanent or inducible electric or magnetic dipole or quadrupole moment that is different than zero are introduced into a light exit layer and oriented by an applied electric or magnetic field. This production method makes it possible to produce a light-emitting device in accordance with the fourth aspect of the invention.

BRIEF DESCRIPTION OF THE DRAWINGS

The invention is explained in greater detail below on the basis of exemplary embodiments with the aid of 7 figures, in which.

DETAILED DESCRIPTION OF THE DRAWINGS

Figure 1:
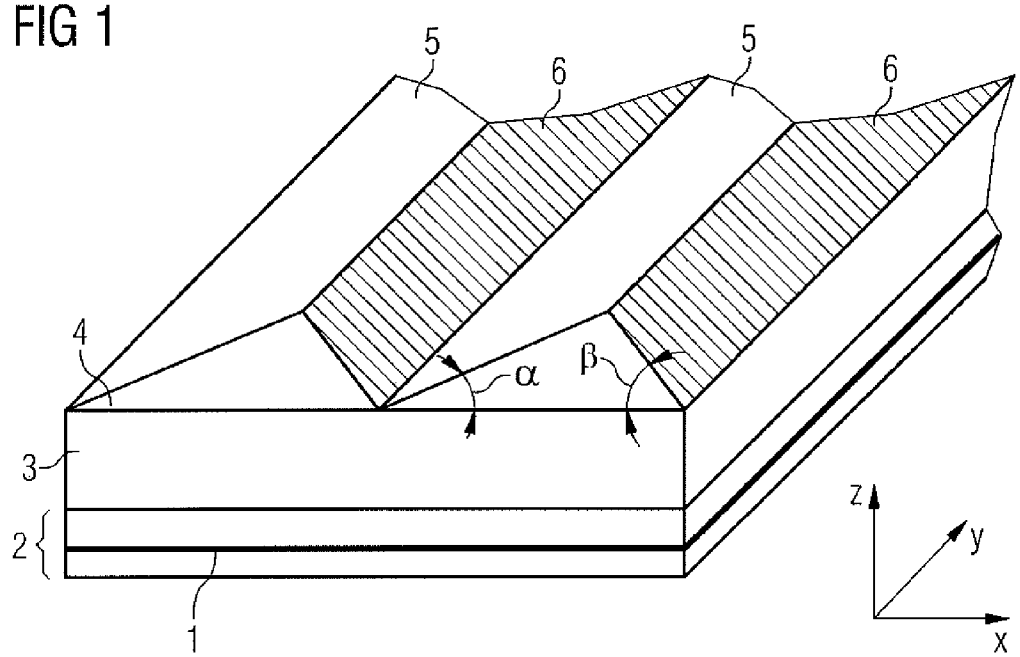
FIG. 1 shows a three-dimensional schematic illustration of a light-emitting device.

FIG. 1 illustrates a first exemplary embodiment of a light-emitting device in a three-dimensional schematic drawing.

A light-emitting layer 1 is arranged within an OLED (organic light-emitting diode) layer construction 2. The OLED layer construction 2 is situated on a first side of an areal substrate 3. A light exit layer 4 is provided on the opposite side of the substrate 3 with respect to the OLED layer construction 2. On the side remote from the substrate 3, the light exit layer 4 has a multiplicity of first areas 5, inclined by an angle $\alpha$ with respect to the substrate 3 and also a multiplicity of second areas 6 inclined by an angle $\beta$ with respect to the substrate 3.

The light-emitting device in FIG. 1 is embodied as a "bottom emission" OLED. In the case of such an embodiment, the substrate 3 is transparent, such that the light emitted by the light-emitting layer 1 passes through the substrate 3 to the light exit layer 4. As an alternative, an embodiment as a "top emission" OLED is possible, in the case of which the OLED layer construction 2 is applied to a non-transparent substrate. Instead of the transparent substrate 3 shown in FIG. 1, a transparent passivation layer is then provided on that side of the OLED layer construction 2 which is remote from the non-transparent substrate. All the exemplary embodiments of a light-emitting device that are described in the application can be constructed, by means of a corresponding modification, either on the basis of a "bottom emission" OLED or on the basis of a "top emission" OLED.

The OLED layer construction 2 comprises, besides the light-emitting layer 1, at least one first and one second electrode and one or more layers which serve for injecting charge carriers into the light-emitting layer 1 and thus excite the latter to emit light during operation. The electrode layers can be formed for example from transparent conductive materials such as, for instance indium tin oxide (ITO) or indium zinc oxide, zinc oxide or tin oxide.

The light-emitting layer 1 comprises an organic material as optically active, radiation-generating material. The latter can be for example an organic material having a low molecular weight, also called small-molecule organic material, a polymer or a combination of these two materials.

Small-molecule organic materials are typically applied by thermal evaporation under vacuum conditions. Examples of radiation-generating small-molecule organic materials are tris(8-hydroxyquinolinato)aluminum (Alq), 1,3-bis(N,N-dimethylaminophenyl)-1,3,4-oxidazole (OXD-8), oxo-bis(2-methyl-8-quinolinato)aluminum, bis(2-methyl-8-hydroxyquinolinato)aluminum, bis(hydroxybenzoquinolinato) beryllium (BeQ.sub.2), bis(diphenylvinyl)bisphenylene (DPVBI) and arylamine-substituted distyrylarylene (DSA-amine).

Polymers are usually applied by a spin-on method, also called spincasting or spincoating. As an alternative, a spatially selective deposition can also be effected, e.g. by means of inkjet printing. Examples of radiation-generating polymers are poly(p-phenylene vinylene) and polyarylenevinylene and also copolymers of arylene-vinylene oligomers, polyarylenes, polyquinoline and respectively their derivatives and mixtures.

The light exit layer 4 is a layer which is applied to the substrate 3 and which has a multiplicity of prisms arranged parallel to one another, wherein the first areas 5 and the second areas 6 form that surface of the light-emitting device which is remote from the OLED layer sequence 2. For reasons of clarity, FIG. 1 illustrates only in each case two of the multiplicity of first areas 5 and second areas 6.

Neither the first areas 5 nor the second areas 6 are arranged parallel to the light-emitting layer 1. Consequently, they are also not parallel to the plane in which the light-emitting device is areally formed. In all the exemplary embodiments shown, said plane in which the light-emitting device is areally formed is defined as the XY plane.

In this case, the extent of the prisms in the Y-direction (length), is preferably of macroscopic orders of magnitude, that is to say for example in the range of millimeters to decimeters.

Preferably, the entire surface of the light-emitting device is covered by prisms which are continuous in the Y-direction. The width of the prisms in the X-direction is preferably larger than the wavelength of the emitted light, with the result that diffraction effects at the prisms do not become apparent. Preferably, however, the width is of microscopic orders of magnitude, for example in the submillimeter range, with the result that the structuring in the X-direction is not visible from a usual distance of an observer from the light-emitting device.

The first areas 5 of the light exit layer 4 are transparent, whereas the second areas 6 are reflective to light emitted by the light-emitting layer 1. The second areas 6 can be made reflective at a very shallow angle of incidence by vapor deposition with metal particles, by way of example.

To a first approximation, in the case of an OLED having a planar light exit layer arranged parallel to the light-emitting layer, a Lambertian emission profile with a main emission direction perpendicular to the light exit area arises. In the exemplary embodiment shown, only the first areas 5 constitute light exit areas, whereby the emission profile has a main emission direction that is inclined relative to the Z-axis in the direction of the X-axis. In this case, the angle of inclination of the main emission direction of the light-emitting device is substantially determined by the angle $\alpha$. Light which is emitted by the light-emitting layer 1 and reflected by the second areas 6 can, after one or more internal reflections, likewise emerge from the light-emitting device through the transparent first areas 5. In this case, the angle $\beta$ influences both the angular distribution of the emitted light and the frequency of internal reflections. The total intensity and thus the efficiency of the light-emitting device can be optimized by means of a suitable choice of the angle $\beta$.

The structuring of the separate light exit layer 4 is provided in the exemplary embodiment shown. In that case the light exit layer 4 can be a correspondingly structured film applied to the substrate 3. It is also possible to dispense with a separate light exit layer 4 by structuring the surface of the substrate 3 itself.

In addition to the illustrated structuring in the form of parallel prisms each having planar first areas 5 and second areas 6, a structuring with non-planar areas is also conceivable, for example with cylindrical areas. A structuring by pyramidal, conical or lens-shaped elements or area sections is also conceivable.

Figure 2:
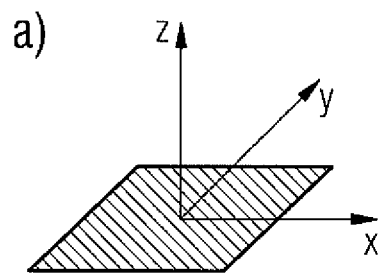
FIG. 2 shows different emission profiles of light-emitting devices.
Figure 2:
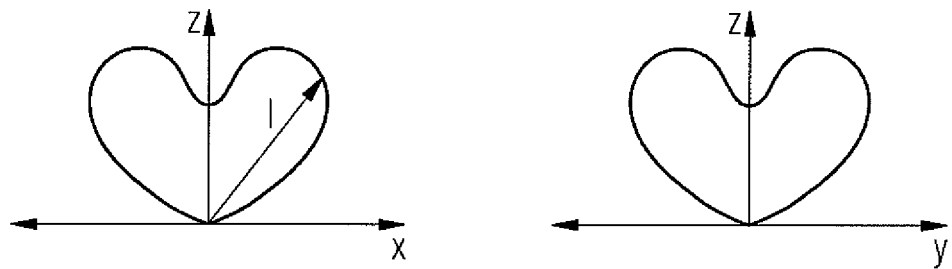
Figure 2:
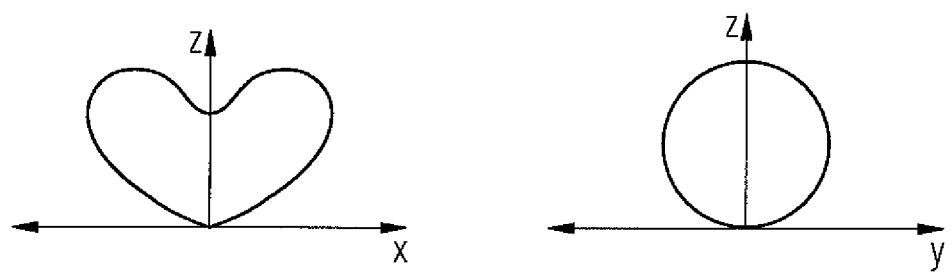
Figure 2:
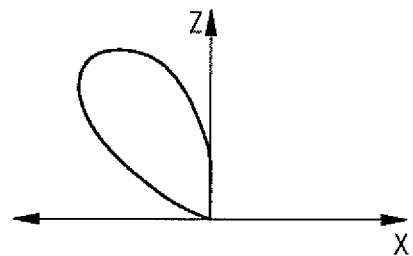

FIG. 2 illustrates various emission profiles (angle-dependent distribution of the emitted intensity) of the light-emitting devices according to the invention.

Firstly, the underlying system of coordinates is indicated in FIG. 2a. The light-emitting device forms, with its lateral areal extent, the XY plane of the system of coordinates. Known OLED structures having a planar light exit area arranged parallel to the light-emitting layer exhibit a Lambertian emission profile in the direction of the Z-axis. However, emission profiles deviating from that are often desired for lighting purposes. Suitable emission profiles are illustrated in FIGS. 2b to 2d.

The emission profiles which are designated as type A-1 and type A-2 and are shown in FIGS. 2b and 2c are distinguished by a symmetrical heart-shaped emission direction distribution having two maxima both in the X-direction and the Y-direction (type A-1) or in one of the two directions (type A-2). These emission patterns are suitable for general lighting purposes in rooms.

The profile shown in FIG. 2d, designated as type B, is highly asymmetrical in at least one of the directions X and Y and is suitable, in particular, for signaling applications, for example for marking steps in darkened surroundings or for realizing non-glare areal wall luminaires.

An emission pattern of type B can be realized with the light-emitting device shown in FIG. 1.

Figure 3:
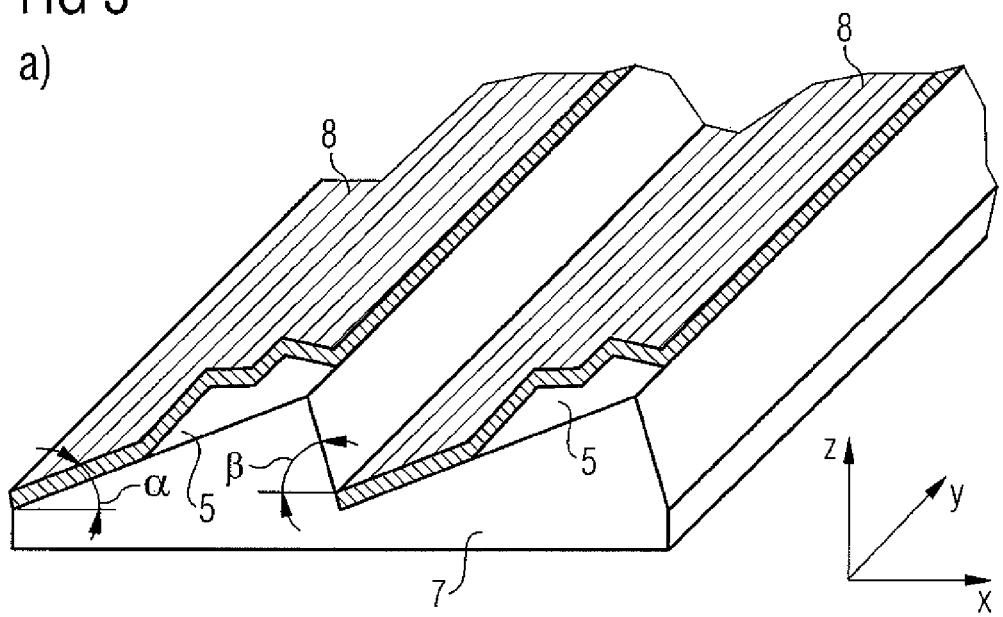
FIG. 3 and FIG. 4 show further light-emitting devices, in each case in a three-dimensional schematic illustration and a plan view.
Figure 3:
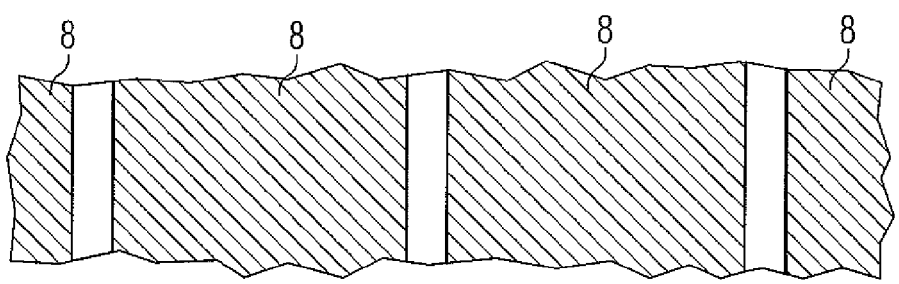

FIG. 3 illustrates a further exemplary embodiment of a light-emitting device in a perspective view (FIG. 3a) and a plan view (FIG. 3b).

The surface of a carrier 7 is structured in the form of a plurality of prisms arranged in a parallel fashion and having first areas 5 and second areas 6. The lateral areal extent of the light-emitting device and of the carrier 7 lies in the XY plane. The first areas 5 are inclined by the angle $\alpha$ and the second areas 7 by the angle $\beta$, relative to said XY plane. Luminous elements 8 are arranged on the first areas 5.

With regard to its surface, the carrier 7 is structured in a manner comparable to the light exit area 4 in the exemplary embodiment shown in FIG. 1. The carrier 7 can be produced from plastic, for example, the structuring of its surface preferably being achieved by means of an injection molding method or a thermoforming method. Furthermore, it is possible to produce the carrier 7 from a metal film or a metal sheet, which is structured by an embossing method.

The luminous elements 8 are functional elements independently of the carrier 7. They can comprise, for example, in each case a substrate and an OLED layer construction having at least one light-emitting layer. With regard to the construction and materials of the OLED layer construction and the light-emitting layer, reference is made to the statements made in connection with the exemplary embodiment in FIG. 1.

In a manner similar to the exemplary embodiment illustrated in FIG. 1, an emission characteristic whose main emission direction is substantially inclined by the angle $\alpha$ relative to the Z-direction is established in the case of the embodiment in FIG. 3 as well. The emission pattern is likewise of type B.

Figure 4:
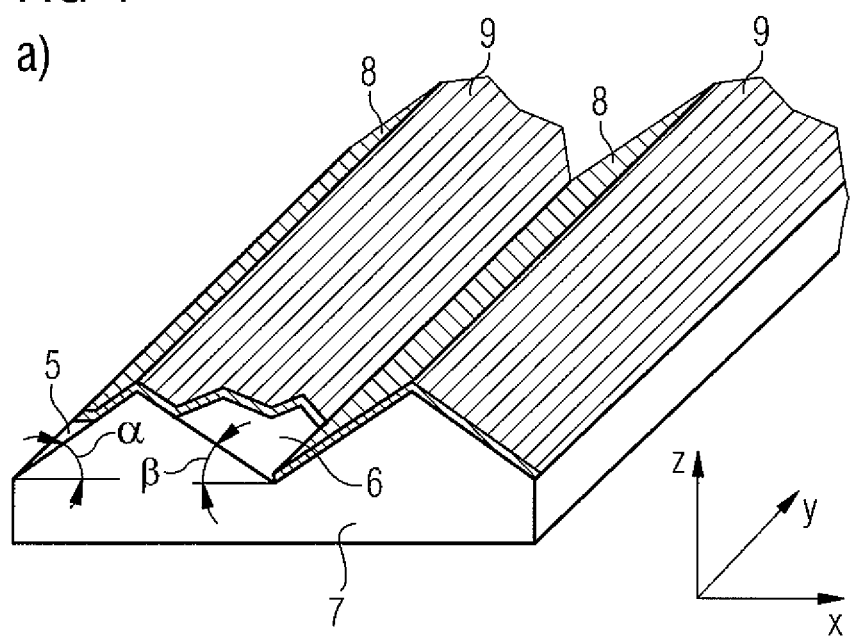
Figure 4:
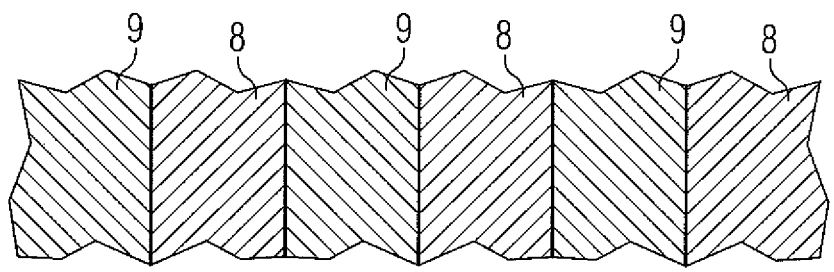

A further exemplary embodiment of a light-emitting device is illustrated in FIG. 4, once again in a perspective view (FIG. 4a) and a plan view (FIG. 4b). As in the case of the exemplary embodiment shown in FIG. 3, a carrier 7 is provided, the surface of which is structured in the form of parallel prisms. In contrast to the exemplary embodiment in FIG. 3, not only the first areas 5 are covered with luminous elements 8, but also the second areas 6 are covered with luminous elements 9.

In the case of the exemplary embodiment in FIG. 4, the surface of the carrier 7 is structured in the form of prisms having the cross section of an isosceles triangle. The arrangement shown results in a symmetrical emission characteristic of type A-2, having two main emission directions that are inclined from the Z-axis by the angle $\alpha=\beta$ in a positive and negative X-direction. In the Y-direction, an emission profile which is, to a first approximation, a Lambertian emission profile, arises given a sufficient extent of the light-emitting device. If the angles $\alpha$ and $\beta$ are chosen such that they are not identical, the two main emission directions are inclined by different angles from the Z-direction. At the same time, the intensity of the emission in the main emission directions is different on account of the resultant areas of different sizes of the luminous elements 8 and luminous elements 9.

Figure 5:
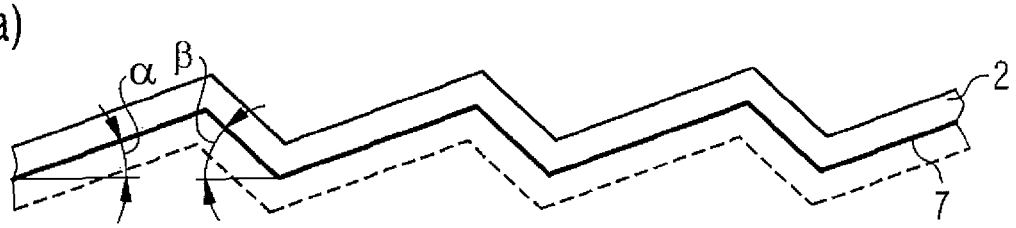
FIG. 5 shows three further light-emitting devices in cross section.
Figure 5:
Figure 5:

A further light-emitting device is illustrated in cross section in FIG. 5a.

An OLED layer construction 2 is applied on a substrate 3, the surface of which is structured by prisms arranged in a parallel fashion. Identical reference symbols in the figures designate identical or identically acting elements.

In contrast to the exemplary embodiments shown in FIGS. 3 and 4 respectively, the substrate 3 also performs the function of the carrier 7 in the case of the exemplary embodiment in FIG. 5a. It is evident from this that separate luminous elements having a substrate are not used, rather the OLED layer construction 2 is applied directly to the structured substrate. With regard to the construction and the materials of the OLED layer construction and a light-emitting layer contained therein, reference is once again made to the explanations in connection with the exemplary embodiment in FIG. 1.

In the exemplary embodiment shown, the angles $\alpha$ and $\beta$ are chosen such that they have different magnitudes. This results in a distribution of type A-2 with different intensities in both main emission directions. The substrate 3 can be produced from plastic, for example, which is correspondingly structured by means of an injection molding method or by means of a thermoforming method. If the light-emitting device is constructed in the form of a "bottom emitter" OLED, in which the radiation emerges through the substrate 3, it is necessary, in order to achieve a corresponding emission characteristic, also to correspondingly structure the opposite surface of the substrate 3 with respect to the OLED layer construction 2. That is indicated by the dashed line in FIG. 5a. By contrast, if the light-emitting device is constructed as a "top emitter" OLED the opposite side of the substrate with respect to the OLED can assume any desired shaping, for example can be planar. In the case of a "top emitter" OLED, the substrate 3 can also be non-transparent and can be formed by a metal film or a metal sheet, for example, into which the corresponding surface structuring is embossed.

FIGS. 5b and 5c show further surface structurings for light-emitting devices which can be used in connection with the exemplary embodiment illustrated in FIG. 5a.

In particular, it should be emphasized that the surface of the substrate 3 needs not necessarily be composed of different planar areas, but rather can also have curvilinearly bounded areas. By means of the surface shaping chosen, it is possible to vary the emission characteristic in the X-direction within wide limits. By way of example, the geometry shown in FIG. 5b results in an intensity distribution of type A-2. In this case, the distribution is symmetrical with respect to the Z-axis and, depending on the radius of curvature and depth of the cylinder sections forming the surface, what can be achieved is that two mutually separate main emission directions arise, inclined from the Z-axis in the direction of the positive and negative X-axis, respectively, or one main emission direction arises in the direction of the Z-axis, but the emission profile is directed in a lobe-like fashion compared with a Lambertian emission profile. An emission characteristic of type B can be achieved with a surface geometry as shown in FIG. 5c.

Figure 6:
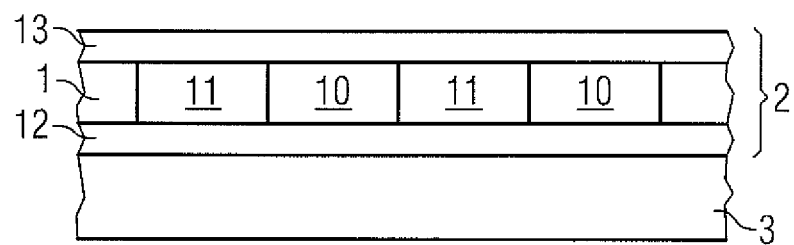
FIG. 6 shows a further light-emitting device in cross section at two different points in time in its production process.
Figure 6:
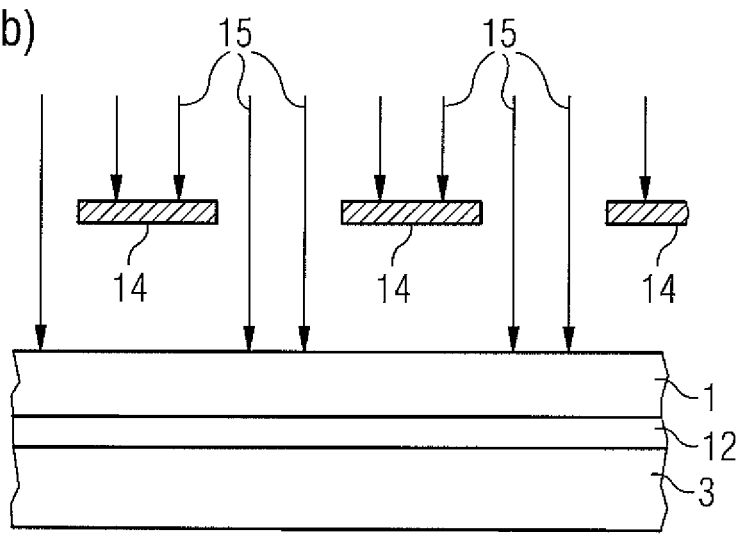

FIG. 6a shows the cross section of a further light-emitting device.

An OLED layer construction 2 is arranged on a substrate 3. Said OLED layer construction has a first electrode 12 facing the substrate 3, a light-emitting layer 1 and, finally, a second electrode 13. In this case, the light-emitting layer 1 has strip-type first regions 10 and second regions 11 extending alternately into the plane of the drawing. The OLED layer construction 2 can comprise further layers (not shown here). With regard to its construction and suitable materials, reference is once again made to the explanations concerning FIG. 1.

In the case of the exemplary embodiment in FIG. 6a, unlike in the case of the exemplary embodiments shown previously, a change in the emission characteristic of the light-emitting device is not achieved by means of the orientation of the light exit areas, but rather by means of a diffraction of the light within the light-emitting layer 1. For this purpose, the light-emitting layer 1 is structured by the different strip-type first regions 10 and second regions 11, wherein the two regions 10 and 11, respectively, differ in terms of their refractive index. Since diffraction effects of the light are significant in this exemplary embodiment, in contrast to the examples shown previously, the dimensions of the first regions 10 and second regions 11 in the X-direction (strip width) are of the order of magnitude of the light emitted by the light-emitting layer 1. The diffraction phenomena that arise are comparable with the diffraction at a grating. Within the cavity shaped by inner and/or outer interfaces of the light-emitting device, an intensity pattern forms which has larger intensity components parallel to the X-axis by comparison with a device comprising a homogeneous light-emitting layer 1. Accordingly, the emission profile of the light-emitting device changes from that of a Lambertian emitter to an emitter of type A-2.

FIG. 6b illustrates how the light-emitting layer 1 can be structured during the production process. The light-emitting device, which, at the point in time of the structuring of the light-emitting layer 1, comprises the substrate 3, the first electrode 10 and the light-emitting layer 1, is irradiated with UV light through a mask 14. Where the UV radiation 15 impinges on the light-emitting layer 1, the structure of the latter is altered at the molecular level, for example by an alteration of the degree of polymerization of an organic polymer in the light-emitting layer 1. The altered molecular structure is accompanied by a change in the refractive index.

Figure 7:
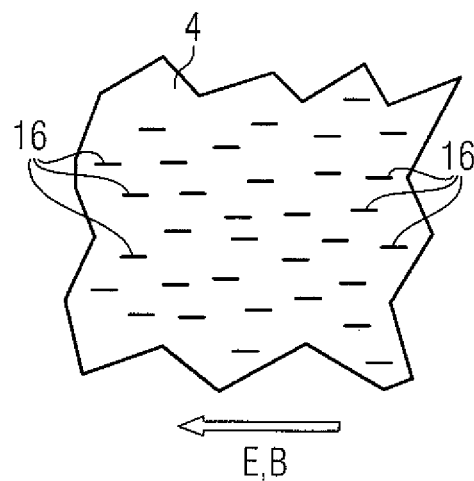
FIG. 7 shows a plan view of a further light-emitting device.

FIG. 7 shows a further light-emitting device in plan view. In this embodiment, scattering particles 16 are arranged on or in a light exit layer 4, through which the light from a light-emitting layer exits.

Scattering particles are transparent or non-transparent particles, the order of magnitude of which can lie in the range of a few $\mu$m to a few tens of $\mu$m. The particles can be arranged within the light exit layer 4 or else project wholly or partly from said layer. In this case, the light exit layer 4 can be a planar layer lying parallel to a substrate and an OLED layer construction. The light exit layer 4 can also be realized by a substrate or a passivation layer for the OLED layer stack.

The scattering particles 16 are distinguished by a permanent or inducible electric or magnetic dipole or quadrupole moment which is different than zero and which defines a principal axis of the scattering particles. By means of an electric (E) and/or magnetic (B) oriented field applied during the production process, symbolized in FIG. 7 by a vector arrow, the scattering particles 16 are oriented with regard to their principal axis along a predetermined direction, here the X-axis. By way of example, it is possible to introduce the scattering particles into a polymeric layer and to correspondingly orient them before the layer is cured. Consequently, the orientation frozen in in this way remains even without the orienting electric and/or magnetic field.

Furthermore, the scattering particles 16 are distinguished by an anisotropy in their geometry and/or in their refractive index, such that, relative to the orientation of their principal axis, an anisotropic scattering behavior for light emitted by the light-emitting layer can be observed. The anisotropy in the geometry and/or the refractive index of the oriented scattering particles 16 causes an anisotropic scattering of the light as it emerges from the light-emitting device. Depending on the scattering behavior and degree of anisotropy, this leads to an emission profile of the light-emitting device of type A-1, A-2 or B, deviating from the Lambertian emission profile.

Scattering particles which do not have a dipole or quadrupole moment which is different than zero can also be oriented. By way of example, self-assembling molecules can be used as scattering particles 16, which molecules orient themselves under suitable conditions during the production process. Furthermore, it is possible to embed scattering particles 16, in particular those having a geometrical anisotropy, into an expandable film and to orient them by expanding the film along a direction.

The explanation of the invention on the basis of the exemplary embodiments should not be understood as a restriction of the invention thereto. Rather, the invention relates to all arrangements comprising the features mentioned in the claims. Furthermore, the invention encompasses all features mentioned in the description and also the combination of said features, even if these are not explicitly mentioned in the claims or the description.

The invention claimed is:

1. A light-emitting device, comprising:
a plurality of light-emitting elements; and
a carrier comprising:
a plurality of mutually parallel first areas; and
a plurality of mutually parallel second areas arranged in an inclined fashion with respect to the first areas,
wherein the light-emitting elements are arranged on the first areas, each light-emitting element comprises a substrate and an OLED layer construction having a light-emitting layer comprising an optically active, radiation-generating organic material, and
wherein the light-emitting elements are in direct contact with the first areas of the carrier.

2. The light-emitting device as claimed in claim 1, wherein the carrier comprises prisms arranged in a parallel fashion, the prisms having areas forming the first areas and the second areas of the carrier.

3. A light-emitting device, comprising:
a substrate; and
an OLED layer construction applied to a surface of the substrate and having at least one light-emitting layer comprising an optically active, radiation-generating organic material,
wherein the surface of the substrate is height-structured periodically in a lateral direction,
the OLED layer construction is in direct contact with the height-structured surface of the substrate, covering and conforming to the height-structured surface of the substrate, and
the surface of the OLED layer construction facing way from the substrate is height-structured in the same way as the height-structured surface of the substrate.

4. The light-emitting device as claimed in claim 3, wherein the height structuring rises and falls linearly in one lateral direction and the surface of the substrate has substantially plane areas.

5. A light-emitting device, comprising
a substrate having a first side and a second side opposite the first side;
an OLED layer construction having a light-emitting layer comprising an optically active, radiation-generating organic material;
wherein the light-emitting layer has strip-type first regions and second regions arranged alternately in a lateral direction,
wherein the first regions and the second regions have different refractive indices and comprise the same material as the light-emitting layer, and
wherein the first regions and the second regions are formed inside the light-emitting layer.

6. The light-emitting device as claimed in claim 5, wherein dimensions of the first regions and of the second regions in the lateral direction are of the order of magnitude of a wavelength of the light emitted by the light-emitting layer.

7. The light-emitting device as claimed in claim 6, wherein the dimensions of the first regions and of the second regions in the lateral direction is smaller than 5-times the wavelength.

8. A method for producing the light-emitting device of claim 5, the method comprising;
forming the first regions and the second regions having different refractive indices inside of the light-emitting layer by irradiating first regions of the light-emitting layer with UV light through a mask and not irradiating the second regions, wherein irradiation of the first regions alters the light-emitting layer of the irradiated first regions at a molecular level, to change the refractive index in the first regions with respect to the refractive index of the second regions.

9. A light-emitting device, comprising:
a substrate having first side and a second side opposite the first side;
an OLED layer construction having a light-emitting layer comprising an optically active, radiation-generating organic material in direct contact with the first side of the substrate;
a light exit layer in direct contact with a side of the OLED layer construction facing away from the substrate, the light exit layer being a planar layer lying parallel to the substrate and the OLED layer construction; and
a multiplicity of anisotropic scattering particles arranged in or on the light exit layer, the anisotropic scattering particles being oriented along a lateral direction of the light-emitting device.

10. A method for producing the light-emitting device according to claim 9, comprising:
introducing scattering particles having a permanent or inducible electric or magnetic dipole or quadrupole moment that is different than zero into the light exit layer; and
applying an electric or magnetic field to the scattering particles to orient the scattering particles.

* * * * *